(12) United States Patent
Wanzakhade et al.

(10) Patent No.: US 7,000,066 B1
(45) Date of Patent: Feb. 14, 2006

(54) PRIORITY ENCODER CIRCUIT FOR CONTENT ADDRESSABLE MEMORY (CAM) DEVICE

(75) Inventors: Sanjay M. Wanzakhade, San Jose, CA (US); Richard K. Chou, Palo Alto, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 333 days.

(21) Appl. No.: 10/320,053

(22) Filed: Dec. 16, 2002

Related U.S. Application Data

(60) Provisional application No. 60/343,973, filed on Dec. 27, 2001.

(51) Int. Cl.
*G06F 12/00* (2006.01)

(52) U.S. Cl. .................. 711/108; 365/49; 365/189.07; 706/50

(58) Field of Classification Search ................ 711/108; 365/49, 189.07; 706/50
See application file for complete search history.

(56) References Cited

U.S. PATENT DOCUMENTS

| | | | | |
|---|---|---|---|---|
| 5,555,397 A | * | 9/1996 | Sasama et al. | 711/158 |
| 5,619,446 A | * | 4/1997 | Yoneda et al. | 365/49 |
| 5,818,786 A | * | 10/1998 | Yoneda | 365/230.03 |
| 6,061,262 A | * | 5/2000 | Schultz et al. | 365/49 |
| 6,069,573 A | * | 5/2000 | Clark et al. | 341/50 |
| 6,268,807 B1 | | 7/2001 | Miller et al. | |
| 6,307,767 B1 | * | 10/2001 | Fuh | 365/49 |
| 6,324,087 B1 | * | 11/2001 | Pereira | 365/49 |

\* cited by examiner

*Primary Examiner*—Pierre Michel Bataille
*Assistant Examiner*—Sheng-Jen Tsai
(74) *Attorney, Agent, or Firm*—Bradley T. Sako

(57) ABSTRACT

A priority encoder circuit (300) for a content addressable memory (CAM) device is disclosed that may include a priority selection circuit (310) that receives match results (M0 to Mz) and provides prioritized match results (P0 to Pz), and a logic section (350) that logically combines prioritized match results (P0 to Pz) to generate a smaller number of encoder inputs (RWL0 to RWLr). A logic section (350) can also generate a first portion (ID0) of an encoded value (ID0 to IDX). Encoder entries (314-0 to 314-r) may each generate a second portion (ID1 to IDX) of an encoded value (ID0 to IDX).

15 Claims, 4 Drawing Sheets

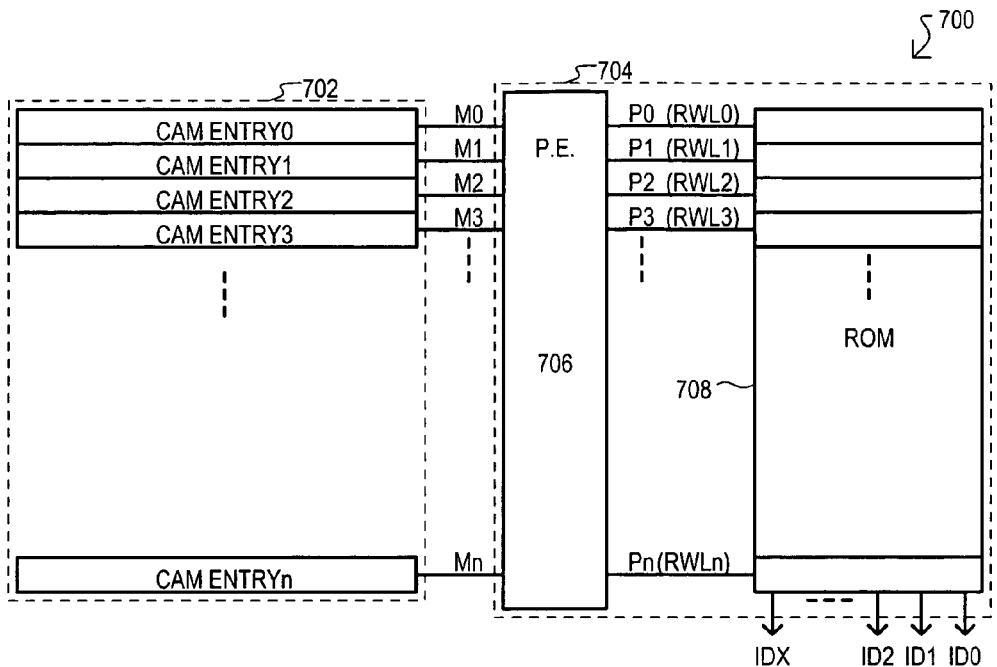
FIG. 7 (BACKGROUND ART)
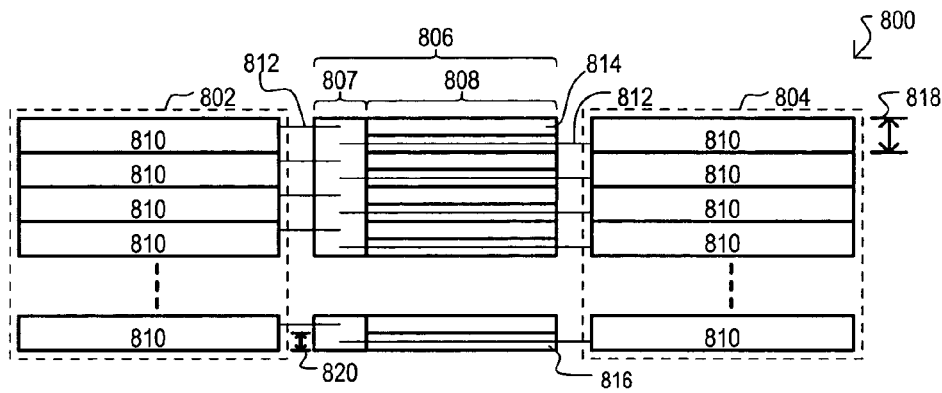
FIG. 8 (BACKGROUND ART)
| | ID0 | ID1 | ID2 |
|---|---|---|---|
| ROM0 | 0 | 0 | 0 |
| ROM1 | 1 | 0 | 0 |
| ROM2 | 0 | 1 | 0 |
| ROM3 | 1 | 1 | 0 |
| ROM4 | 0 | 0 | 1 |
| ROM5 | 1 | 0 | 1 |
| ROM6 | 0 | 1 | 1 |
| ROM7 | 1 | 1 | 1 |
FIG. 10 (BACKGROUND ART)

PRIORITY ENCODER CIRCUIT FOR CONTENT ADDRESSABLE MEMORY (CAM) DEVICE

This application claims the benefit of provisional application Ser. No. 60/343,973 filed Dec. 27, 2001.

TECHNICAL FIELD

The present invention relates generally to priority encoder circuits and more particularly to priority encoder circuits for a content addressable memory (CAM) device.

BACKGROUND OF THE INVENTION

Conventionally, a content addressable memory (CAM) device may include a priority encoder circuit. A conventional priority encoder circuit can typically receive a number of match results that correspond to CAM entries. Such match results can have an active level (indicating a match condition) and an inactive level (indicating a no match condition). A priority encoder circuit may encode a highest priority match result into an output value. Such an output value is typically a binary value that is often referred to as an index value.

Conventional priority encoders typically include a priority select circuit and an encoding circuit, such as a read-only-memory (ROM) type circuit. When multiple active match results are received, a priority selection circuit can select one of the active input signals according to predetermined criteria. For example, input signals may have a particular order, and a priority selection circuit may select a lowest active input signal of the particular order. It is noted that in some instances, a priority selection may also be referred to as a priority encoder.

An active prioritized match result provided by a conventional priority selection circuit can then be provided as an input to a ROM-type circuit. A ROM-type circuit may then generate an index value corresponding to the particular active match indication.

To better understand the structure and operation of conventional priority encoder circuits, and to better understand the various features of the disclosed embodiments, a number of conventional circuits will now be described.

Referring now to FIG. 7, a conventional CAM device that includes a conventional priority encoder circuit is set forth in block schematic diagram and designated by the general reference character 700. A CAM device 700 may include a number of CAM entries 702 and a priority encoder circuit 704. CAM entries 702 may include multiple CAM entries, each of which can store a data value for comparison with an applied comparand value (or key). Match results generated by CAM entries 702 are shown as M0 to Mn.

A priority encoder 704 may include a priority select circuit 706 and a ROM-type encoder circuit 708. A priority selection circuit 706 may provide prioritized signals P0 to Pn, each of which can correspond to match results M0 to Mn. Thus, signals P0 to Pn can be considered prioritized match results. Thus, assuming that a lowest match result has a highest priority value, if match indication M0, M3 and Mn were active, only a corresponding highest priority output signal P0 would be activated by priority selection circuit 706. That is, a conventional priority select circuit 706 can activate only one prioritized match result for a given search.

A ROM-type circuit 708 may receive output signals P0 to Pn as ROM word line signals RWL0 to RWLn. A different combination of index bit value signals ID0 to IDx may be activated for each different ROM word line (RWL0 to RWLn).

In many cases, a conventional CAM can be subject to various physical layout restrictions. Referring now to FIG. 8, a conventional CAM layout arrangement will be described. FIG. 8 is a top plan view of a CAM device that is designated by the general reference character 800. A CAM device 800 may include first CAM entries 802, second CAM entries 804, and a priority encoder circuit 806. A priority encoder circuit 806 may include a priority selection circuit 807 and a read-only-memory (ROM) encoding circuit 808.

First and second entries (802 and 804) may each include a number of CAM entries 810. CAM entries 810 may provide match results to a priority encoder circuit 806 by signal lines. Two examples of signal lines are shown as 812. A ROM encoding circuit 808 may include a number of ROM entries, each of which can encode a match result into an output value, such as an index value. A top ROM entry is shown as item 814, while a bottom ROM entry is shown as 816.

A priority encoder 806 and ROM encoding circuit 808 may be situated between first CAM entries 802 and second CAM entries 804. Thus, FIG. 8 shows a conventional CAM in which one entry can be situated on either side of a priority encoder 806 and ROM encoding circuit 808 (one entry from first CAM entries 802 on one side, and one entry from second CAM entries 804 on another side).

It is understood that in FIG. 8, circuit dimensions in a vertical direction can be considered proportional between a CAM entries 810 and ROM entries (e.g., 814 and 816). Thus, a measurement 818 can be considered a "height" for CAM entries 810, while a measurement 820 can be considered a "height" for a ROM row (e.g., 814 and 816). A CAM entry height 818 may be dictated by a CAM cell height. Thus, the conventional case of FIG. 8 shows an arrangement in which a CAM cell height can correspond to the height of two ROM entries (e.g., 814 and 816).

Referring now to FIG. 9, a schematic diagram of a portion of a conventional ROM encoding circuit according to one embodiment is set forth and designated by the general reference character 900. A conventional ROM 900 may include a number of ROM entries 902-0 to 902-7. Each ROM entry (902-0 to 902-7) may be connected to a ROM word line RWL0 to RWL7. As shown by FIG. 9, ROM word lines (RWL0 to RWL7) may correspond to prioritized match indications. Thus, in operation, no more than one ROM word line (RWL0 to RWL7) may be active at a time. Each ROM entry (902-0 to 902-7) can encode an activated ROM word line (RWL0 to RWL7) into an output value, a portion of which is shown as ID0 to ID2.

Referring to FIG. 10, a table is set forth showing a response of the conventional ROM encoder circuit shown in FIG. 9.

The above conventional examples have shown arrangements in which two ROM entries may fit within the height of one CAM cell (or a CAM entry height). However, as CAM device capacities are increased, it would be desirable to utilize a same general ROM encoder circuit area to serve a larger number of CAM cells.

One example of a priority encoder/ROM is disclosed in U.S. Pat. No. 6,268,807, issued to Miller et al., on Jul. 31, 2001.

In addition, or alternatively, it may be desirable to arrive at some way to accommodate more CAM entries for a given basic ROM type circuit design, without having to substantially redesign such a ROM type circuit. Such an approach may advantageously utilize existing ROM type circuit designs.

SUMMARY OF THE INVENTION

According to the present invention a content addressable memory (CAM) device can include first, second, third and fourth CAM entries. A second CAM entry may be situated between a first CAM entry and a first side of a priority encoder circuit. A third CAM entry may be situated between a fourth CAM entry and a second side of a priority encoder circuit. A priority encoder circuit may have an encoding circuit with a number of encoder entries that each generates a unique encoded output value.

According to one aspect of the embodiments, each CAM entry can have a CAM entry height dimension with respect to a first direction that is essentially parallel to a first side of a priority encoder circuit. Each encoder entry can have an encoder entry height dimension with respect to a first direction. An encoder entry height may be no more than half a CAM entry height.

According to another aspect of the embodiments, each CAM entry can generate a match indication. Further, each pair of encoding entries can generate a same portion of an index value corresponding to at least four match indications.

According to another aspect of the embodiments, each CAM entry can generate a match indication. Further, a priority encoder circuit can generate a different index value for each match indication.

According to another aspect of the embodiments a CAM device priority encoder circuit may also include a logic section and encoding entries. A logic section can generate a first portion of each index value and encoding entries. Each encoding entries may generate a second portion of an index value corresponding to at least two match indications from different CAM entries.

According to another aspect of the embodiments, a logic section of a CAM device may include a number of logic gates that each combines at least two prioritized match indications to generate an encoding input for an encoding circuit.

According to another aspect of the embodiments, a logic section of a CAM device may include a plurality of activation devices commonly connected to at least one index signal line. Each activation device can connect at least one index signal line to a predetermined potential when one of two or more prioritized match indications is activated.

According to another aspect of the embodiments, a logic section of a CAM device is disposed between a second CAM entry and encoding entries.

The present invention may also include a CAM device that includes a priority encoder with a logic section and an encoding section. A logic section may receive at least X prioritized input signals, where X is an integer greater than 4. A logic section may provide less than X encoder input signals and generate a first portion of an encoded output value. An encoding section can receive encoder input signals and generate a second portion of the encoded output value for each different encoder input signal.

According to one aspect of the embodiments, a first portion of an encoded value can have fewer bits than the second portion of the encoded value.

According to another aspect of the embodiments, a logic section of a priority encoder circuit can include a number of activation or deactivation devices that connect a first portion bit line to a predetermined potential in response to the activation of a subset of the X prioritized input signals. A first portion bit line can provide a bit value for a first portion of the encoded value.

According to another aspect of the embodiments, a logic section of a priority encoder circuit can include a plurality of logic gates for logically combining at least two prioritized input signals to generate an encoder input signal.

According to another aspect of the embodiments, a logic gate of a logic section can combine one prioritized input signal with an adjacent prioritized input signal.

According to another aspect of the embodiments, a logic gate of a logic section can include an OR-type gate.

According to another aspect of the embodiments, an encoder section of a CAM device can include a read-only-memory (ROM). Encoder input signals can be connected to different ROM word lines of the ROM.

According to another aspect of the embodiments, a priority encoder circuit can be formed in a semiconductor substrate and include a first side and second side. A first group of CAM entries can be disposed on a first side of a priority encoder. A second group of CAM entries can be disposed between a first group of CAM entries and a first side of the priority encoder. A fourth group of CAM entries can be disposed on a second side of a priority encoder. A third group of CAM entries can be disposed between a fourth group of CAM entries and a second side of the priority encoder.

The present invention may further include a CAM having one or more priority encoder and ROM circuits configured to receive a number of entry match results. At least two entries can be sequentially arranged on either side of a priority encoder and ROM circuit.

According to one aspect of the embodiments, sequentially arranged entries can include a second CAM entry between a first CAM entry and a first side of a priority encoder, and a third CAM entry between a fourth CAM entry and a second of a priority encoder.

According to one aspect of the embodiments, a priority encoder can further include a logic section that logically combines groups of at least two match results to generate a plurality of ROM input signals.

According to one aspect of the embodiments, a CAM ROM circuit can include a number of ROM entries. Each ROM entry can generate a different multi-bit encoded value in response to the ROM input signals.

BRIEF DESCRIPTION OF THE DRAWINGS

FIG. 7 is a block diagram of a conventional CAM device.

FIG. 8 is a plan view diagram of a conventional CAM device.

FIG. 10 is table showing the operation of the conventional ROM of FIG. 8.

DETAILED DESCRIPTION OF THE EMBODIMENTS

Various embodiments will now be described in conjunction with various diagrams. The embodiments show a priority encoder circuit that may be included in a content addressable memory (CAM) device.

Figure 1:
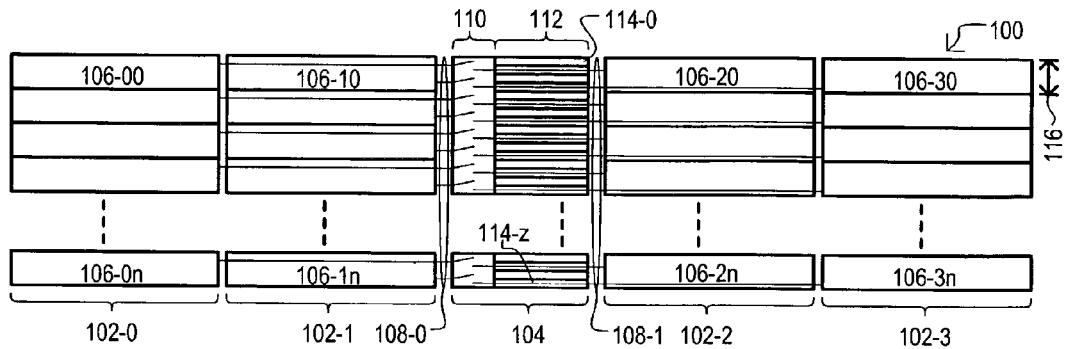
FIG. 1 is a plan view diagram of a content addressable memory (CAM) device according to one embodiment of the present invention.

Referring now to FIG. 1, a CAM device according to one embodiment is set forth in plan view and designated by the general reference character 100. A CAM device 100 may include a first group of CAM entries 102-0, a second group of CAM entries 102-1, a third group of CAM entries 102-2, a fourth group of CAM entries 102-3, and priority encoder circuit 104. Unlike a conventional approach, like that shown in FIG. 7, a CAM device 100 according to one embodiment may include two groups of CAM entries on either side of a priority encoder circuit 104. Thus, FIG. 1 shows first and second groups of CAM entries (102-0 and 102-1) on a left side of priority encoder circuit 104, and third and fourth groups of CAM entries (102-3 and 102-4) on a right side of priority encoder 104. Conventionally, such an arrangement could be avoided, as a centrally disposed priority encoder circuit might not be capable of accommodating such multiple entries. More particularly, conventional approaches may not be capable of providing four encoder entries for one CAM cell height.

Each group of CAM entries (102-0 to 102-3) can include a number of CAM entries. First entries of groups 102-0, 102-1, 102-2, and 102-3 are shown as 106-00, 106-10, 106-20, and 106-30, respectively. Similarly, last entries of groups 102-0, 102-1, 102-2, and 102-3 are shown as 106-0*n*, 106-1*n*, 106-2*n*, and 106-3*n*, respectively.

In this way, a CAM device 100 according to one embodiment may include a sequential arrangement of at least two entries on either side of a priority encoder circuit 104. One side may include a sequence with a CAM entry from a first group 102-0 (e.g., 106-00) and a CAM entry from a second group 102-1 (e.g., 106-10). Another side may include a sequence with a CAM entry from a third group 102-2 (e.g., 106-20) and a CAM entry from a fourth group 102-3 (e.g., 106-30).

Each CAM entry (106-00 to 106-3*n*) can generate a match result in a search operation or the like. Such match results may be provided to a priority encoder 104. The very particular example of FIG. 1 shows first side connections 108-0, which represent connections for supplying match results from first and second CAM entry groups (102-0 and 102-1) to a priority encoder circuit 104. Further, second side connections 108-1 can represent connections for supplying match results from third and fourth CAM entry groups (102-2 and 102-3) to a priority encoder circuit 104.

A priority encoder circuit 104 may include a priority selection circuit 110 and a priority encoding section 112. A priority selection circuit 110 may prioritize received match results to provide a single activated highest priority match result (or no match result, in the event there are no active match indications). A priority encoding section 112 may receive multiple prioritized match results; and encode a single active prioritized match result in to an output value, such as an index value.

In very particular arrangements, a priority encoding section may include a read-only-memory (ROM) type circuit that may output a value in response to each activated prioritized match result.

In the example of FIG. 1, a priority encoding section 112 is shown with encoder entries, a first of which is shown as 114-0 and a last of which is shown as 114-*z*. Each entry (114-0 to 114-*z*) may generate an index value corresponding to a particular prioritized match result. However, it is understood that encoder entries (114-0 to 114-*z*) shown in FIG. 1 can be logical representations of encoder entries, and thus should not necessarily be construed as a physical layout of entries. As will be shown in other embodiments, two encoder entries may be adapted to receive four match results with some additional logic circuitry.

Like the conventional case shown in FIG. 7, in FIG. 1, circuit dimensions in a vertical direction can be considered proportional between CAM entries (106-00 to 106-3*n*) and priority encoding section 112. A CAM cell height measurement is shown in FIG. 1 as item 116. Thus, as shown in FIG. 1, a priority encoding section 112 can be conceptualized as providing four encoder entries per CAM cell height. This is in contrast to the conventional case of FIG. 7, which included two ROM entries per CAM cell height.

A CAM device 100 may be formed in a semiconductor substrate to form all or a portion of an integrated circuit device.

Figure 2:
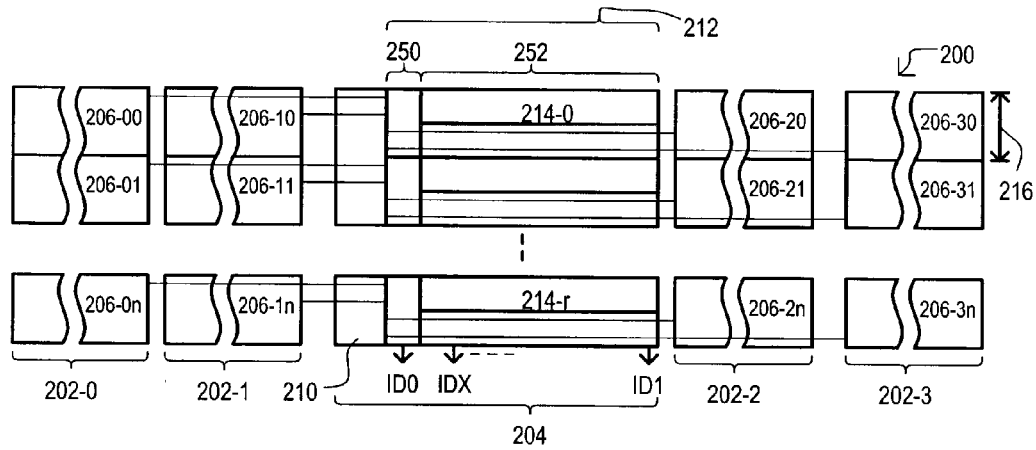
FIG. 2 is a plan view diagram of a CAM device according to another embodiment of the present invention.

Referring now to FIG. 2, a second embodiment of the present invention is shown in plan view, and designated by the general reference character 200. A CAM device 200 may include many of the same items as FIG. 1. Accordingly, like items are referred to by the same reference character but with a first digit being a "2" instead of a "1."

FIG. 2 shows an example in which a priority encoding section 212 may include a logic section 250 as well as encoder entries 252. FIG. 2 also shows an encoded value ID0 to IDX that may be generated by a priority encoding section 212. An encoded value ID0-IDX may be provided by bit lines, each of which may provide one bit of an encoded index value.

As shown in FIG. 2, according to one embodiment, a logic section 250 may provide one portion of an encoded value (ID0) while encoder entries 252 may provide another portion of an encoded value (ID1 to IDX).

In one particular approach, partial encoder entries 252 may be a conventional encoder, such as a ROM-type circuit, as but one example. Such a conventional encoder may encode $2^X$ match results into X-bit values. However, with the inclusion of a logic section 250, a priority encoding section 212 may accommodate additional match results (e.g., $2^{X+1}$).

It is noted that encoder entries 252 may include two entries per CAM cell height 216. However, with the inclusion of logic section 250, every two such encoder entries 252 may provide bit values corresponding to four match results. That is, with the inclusion of a logic section, two encoder entries may provide bit values corresponding to four match results.

Preferably, a CAM device 200 may be formed in a semiconductor substrate to form all or a portion of an integrated circuit device.

Figure 3:
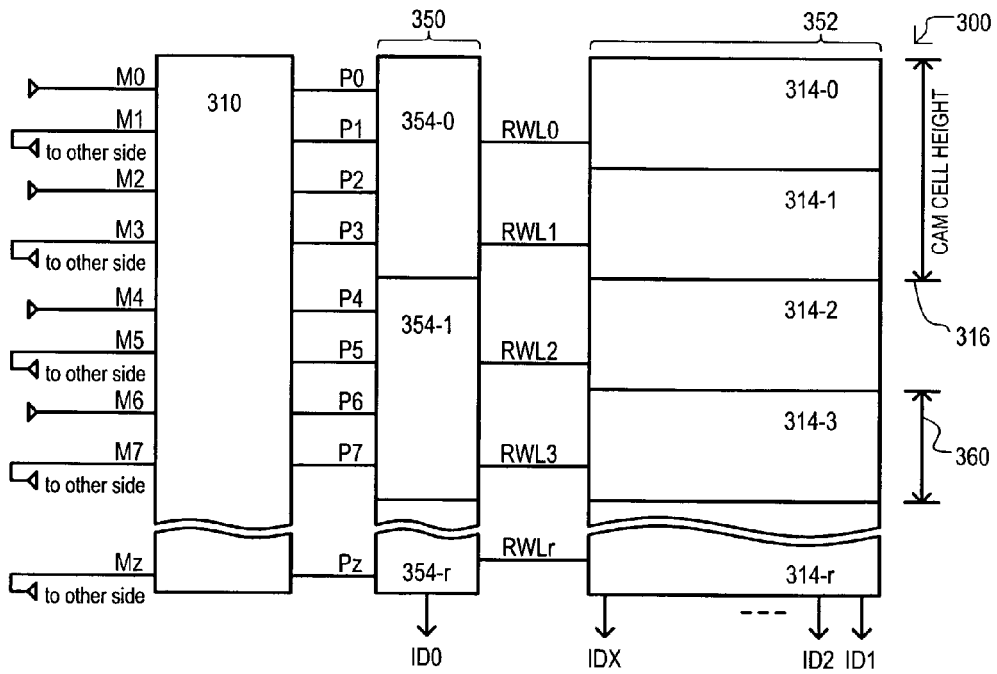
FIG. 3 is a block diagram of a priority encoder circuit according to an embodiment of the present invention.

FIG. 3 is a block diagram of a priority encoder circuit according to an embodiment. A priority encoder circuit is designated by the general reference character 300. A priority encoder circuit 300 may include some of the same general items as shown in FIG. 2. Accordingly, like items are referred to by the same reference character but with a first digit being a "3" instead of a "2."

In FIG. 3, a logic section 350 may be divided into a number of logic circuits 354-0 to 354-r. Each logic circuit (354-0 to 354-r) may logically combine a number of prioritized match results (P0 to Pz) to provide a smaller number of encoder input signals RWL0 to RWLr. In the particular example of FIG. 3, each logic circuit (354-0 to 354-r) can logically combine four prioritized match results (P0 to Pz) to generate two encoder input signals (RWL0 to RWLr).

In addition to generating encoder input signals (RWL0 to RWLr) in response to prioritized match results (P0 to Pz), a logic section 350 may also generate at least a portion of a resulting encoded value. In the particular example of FIG. 3, a logic section 350 may generate one bit (ID0) of an encoded value.

In the embodiment of FIG. 3, two encoder entries 314-0 to 314-r may fit within a CAM cell height measurement 316. Looked at in another way, encoder entries (314-0 to 314-r) may have an encoder entry height 360 that is no more than one half a CAM cell height 316. Yet, two such encoder entries (314-0 to 314-r) may generate results corresponding to four match results. This is in contrast to conventional approaches in which one encoder entry corresponds to one match result.

In addition or alternatively, each logic circuit (354-0 to 354-r) may fit within a CAM cell height 316. For example, in FIG. 3 a vertical dimension of each logic circuit (354-0 to 354-r) may be no greater than a CAM cell height 316.

Referring still to FIG. 3, a priority selection circuit 310 may receive match results M0 to Mz, and prioritize such results into prioritized match results P0 to Pz. Match results (M0 to Mz) may be received from at least two different sides of a CAM device. In the particular example illustrated, even match results (M0, M2, etc.) may be received from one side of a device (left side in the figure), while odd match results (M1, M3, etc.) may be received from another side of a device (right side in the figure). Of course, such an arrangement is but one possible example.

In one very particular approach, encoder entries 352 may be ROM type entries, and encoder inputs (RWL0 to RWLr) may be ROM word lines.

Figure 4:
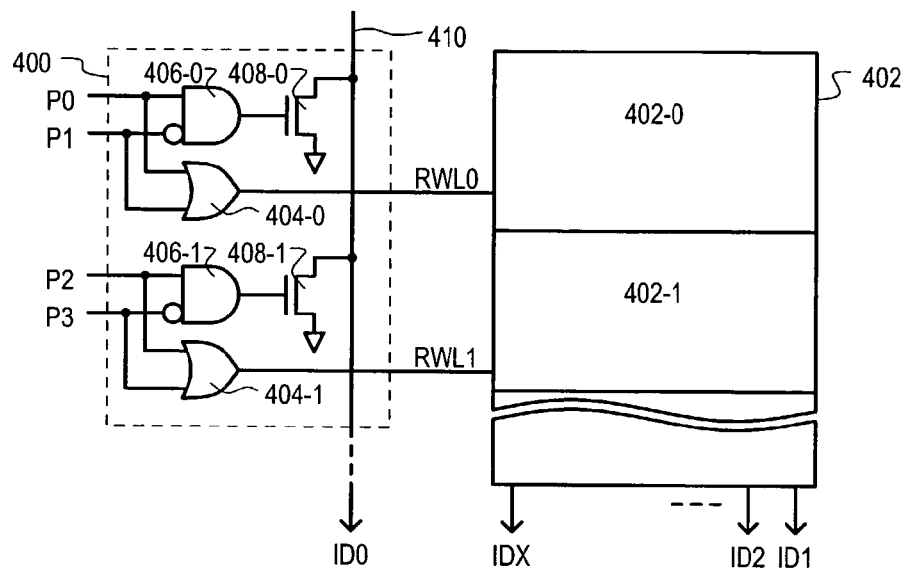
FIG. 4 is a schematic diagram of a logic circuit and encoder entries according to an embodiment of the present invention.

Referring now to FIG. 4, one example of a logic circuit according to an embodiment is set forth in schematic diagram and designated by the general reference character 400. In FIG. 4, a logic circuit 400 may receive four prioritized match results P0 to P3, and provide two encoder inputs RWL0 and RWL1 to encoder entries 402-0 and 402-1, respectively. Note that in this case, a ROM can be an encoder.

In the very particular example of a FIG. 4, a logic circuit 400 may include first logic gates 404-0 and 404-1, second logic gates 406-0 and 406-1, and activation devices 408-0 and 408-1.

First logic gates (404-0 and 404-1) may logically combine two prioritized match results to generate an encoder input. In the example shown, first logic gates (404-0 and 404-1) may each include an OR-type gate that logically combines adjacent match results. Thus, first logic gate 404-0 logically ORs match results P0 and P1 to generate encoder input RWL0. Similarly, first logic gate 404-1 logically ORs match results P2 and P3 to generate encoder input RWL1.

Of course, OR-type gates may include OR gates, NOR gates, or "wire" OR/NOR type gates, to name but a few examples.

Activation devices 408-0 and 408-1 may connect a signal line 410 to a potential according to predetermined match result values. In the particular example of a FIG. 4, each activation device (408-0 and 408-1) may be turned on when one of two match results is activated. More particularly, activation device 408-0 may be turned on when match result P0 is active (high, in this case) and match result P1 is inactive (low in this case). Further, FIG. 4 shows a case in which a signal line 410 may be precharged. Accordingly, activation devices (408-0 and 408-1) may include transistors that discharge such a precharge voltage. More particularly, activation devices (408-0 and 408-1) can include n-channel insulated gate field effect transistors having drains connected to signal line 410, and sources connected to a lower power supply voltage (e.g., ground). Of course, activation devices could be charging devices in alternate embodiments.

In FIG. 4, second logic gate (406-0 and 406-1) can control activation devices 408-0 and 408-1. In the very particular example shown, second logic gates (406-0 and 406-1) may each include an AND-type gate that logically combines one match result with an inverse of an adjacent match result. Thus, second logic gate 406-0 logically ANDs match result P0 with an inverse of match result P1 to generate a control signal for activation device 408-0. Similarly, second logic gate 406-1 logically ANDs match result P2 with an inverse of match result P3 to generate a control signal for activation device 408-1.

A signal line 410 may be a bit line that provides one bit (ID0) of an encoded value (ID0 to IDX). In FIG. 4, remaining bits (ID1 to IDX) of an encoded value may be generated by encoder entries 402.

It will be recalled that a conventional priority encoder circuit encoder can activate one encoder input (e.g., ROM word line) for each prioritized input signal. However, according to the present invention, and as illustrated by example in FIG. 4, a logic circuit 400 may essentially "collapse" an encoder, as an encoder input (RWL0 or RWL1) may be activated by more than one prioritized input signal.

It follows that a logic circuit 400 may be repeated for each group of four prioritized match indications. Thus, a next logic circuit could receive prioritized match indications P4 to P7 and output encoder inputs RWL2 and RWL3. Such a logic circuit would have the same relationship to signal line 410 as logic circuit 400.

It is also noted that logic circuit 400 and corresponding signal line 410 can be situated on one side of encoder entries 402. Such an arrangement may reduce wiring complexity, as control signals for activation devices (408-0 and 408-1) would not have to run over other portions of encoder entries 402.

Figure 5:
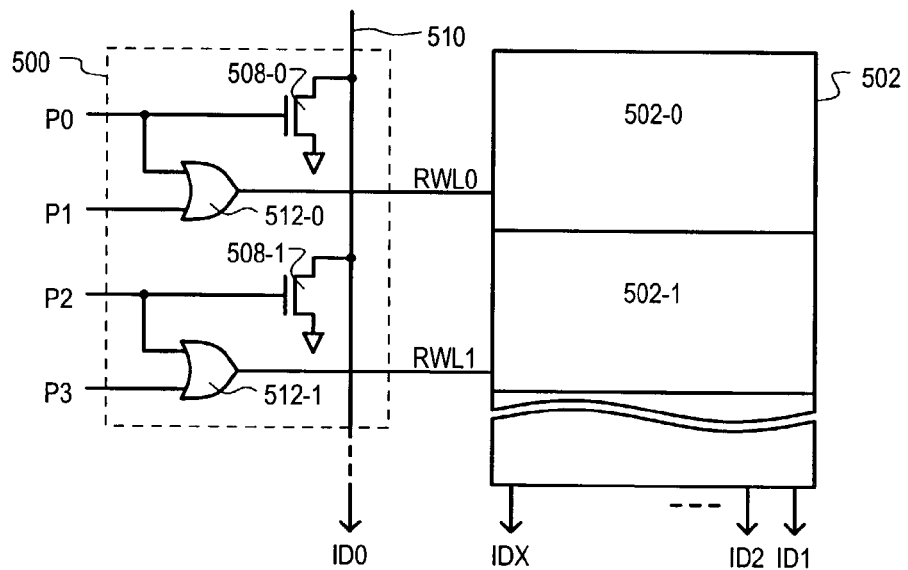
FIG. 5 is a schematic diagram of a logic circuit and encoder entries according to another embodiment of the present invention.

FIG. 5 shows a preferred embodiment of a logic circuit. Such a preferred embodiment is designated by the general reference character 500. Like the embodiment of FIG. 4, a logic circuit 500 can receive four prioritized match results P0 to P3, and provide two encoder inputs RWL0 and RWL1 to encoder entries 502. However, the embodiment of FIG. 5 may eliminate second logic gates.

It will be recalled that a priority selection circuit may output prioritized match results. Such match results may be prioritized by ensuring that only a highest priority match indication is activated in response to a search, or the like. If reference is made back to FIG. 5, it follows that in such an approach, in normal operations only one prioritized match indication can be active at any given time. Thus, second gates may be excluded. Such a modification is shown in FIG. 5.

In the very particular example of a FIG. 5, a logic circuit 500 may include logic gates 512-0 and 512-1 and activation devices 508-0 and 508-1. Logic gates (512-0 and 512-1) may logically combine two prioritized match results to generate an encoder input. Like first logic gates (404-0 and 404-1), logic gates (512-0 and 512-1) may each include an OR-type gate that logically combines adjacent match results.

Activation devices 508-0 and 508-1 may have the same general arrangement as activation devices (408-0 and 408-1) of FIG. 4. However, unlike FIG. 4, in FIG. 5 each activation device (508-0 and 508-1) may be controlled according to one of two prioritized match results. Thus, in the example of FIG. 5, activation device 508-0 may be controlled according to prioritized match result P0, while activation device 508-1 may be controlled according to prioritized match result P1. In this way, a logic circuit 500 may provide an essentially same functionality as logic circuit 400, but be more compact in form.

Figure 6:
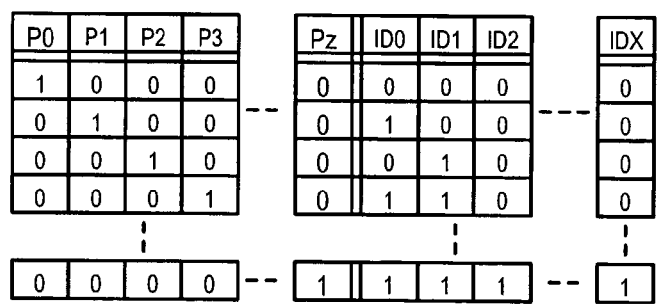
FIG. 6 is a table showing the response of the logic circuits of FIGS. 4 and 5.
Figure 9:
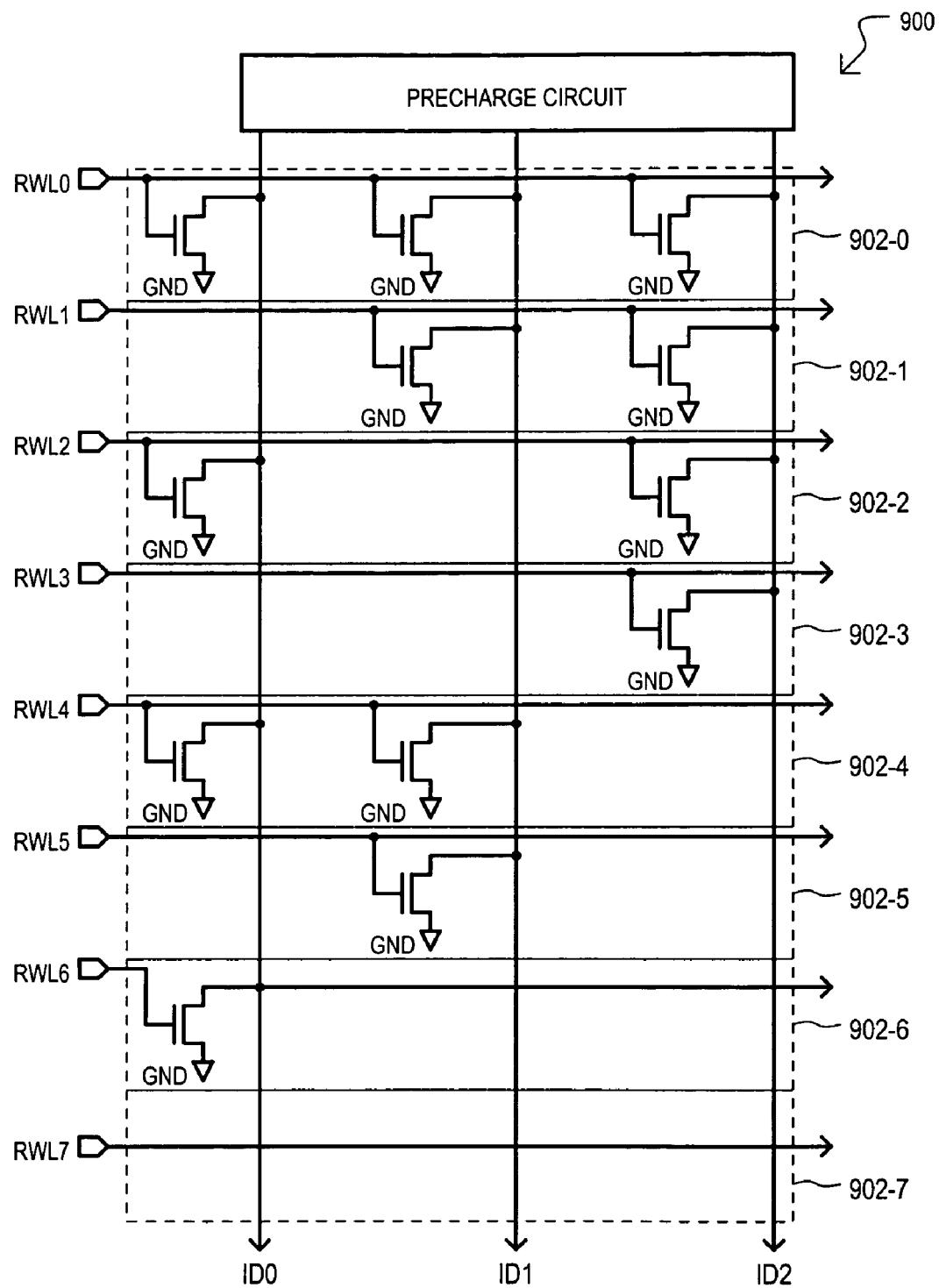
FIG. 9 is a schematic diagram of a conventional ROM.

FIG. 6 is a table showing the response of a logic circuit and encoder entries, like those shown in FIGS. 5 and 6. It can be seen that logic circuits may provide an alternating response for bit ID0 (0 or 1), while remaining bits (ID1 to IDX) can be provided by encoding entries. However, unlike conventional approaches, each encoding entry may provide a portion of an encoded value (ID1 to IDX) for two match indications, rather than one. For example, in FIG. 5 encoder entry 502-0 may provide bits ID1 to IDX for prioritized match indications P0 and P1, while encoder entry 502-1 may provide bits ID1 to IDX for prioritized match indications P2 and P3.

It is understood that while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A content addressable memory (CAM) device, comprising;
   a second CAM entry between a first CAM entry and a first side of a priority encoder circuit;
   a third CAM entry between a fourth CAM entry and a second side of the priority encoder circuit;
   the priority encoder circuit having an encoding circuit with a plurality of encoder entries that each generates a unique encoded output value;
   each CAM entry has a CAM entry height dimension with respect to a first direction that is essentially parallel to the first side; and
   each encoder entry has an encoder entry height dimension with respect to the first direction that is no more than half the CAM entry height dimension.

2. The CAM device of claim 1, wherein:
   each CAM entry is configured to generate a match indication; and
   each pair of encoding entries is configured to generate a same portion of an index value corresponding to at least four match indications.

3. The CAM device of claim 1, wherein:
   each CAM entry is configured to generate a match indication; and
   the priority encoder circuit is configured to generate a different index value for each match indication.

4. The CAM device of claim 1, wherein:
   the priority encoder circuit further includes
      a logic section configured to generate a first portion of each index value, and
      the encoding entries are each configured to generate a second portion of an index value corresponding to at least two match indications from different CAM entries.

5. The CAM device of claim 4, wherein:
   the logic section includes a plurality of logic gates that each combines at least two prioritized match indications to generate an encoding input for the encoding circuit.

6. The CAM device of claim 4, wherein:
   the logic section includes a plurality activation devices commonly connected to at least one index signal line, each activation device coupling the at least one index signal line to a predetermined potential when one of at least two prioritized match indications is activated.

7. The CAM device of claim 4, wherein:
   the logic section is disposed between the second CAM entry and the encoding entries.

8. A semiconductor device, comprising:
   a priority encoder circuit comprising,
      a logic section coupled to receive at least X prioritized input signals, where X is an integer greater than 4, and provide less than X encoder input signals, the logic section generating a first portion of an encoded output value, and
      an encoding section that receives the less than X encoder input signal and generates a different second portion of the encoded output value for each different encoder input signal.

9. The semiconductor device of claim 8, wherein the first portion of the encoded value has fewer bits than the second portion of the encoded value.

10. The semiconductor device of claim 8, wherein:
    the logic section includes a plurality of activation devices that couple a first portion bit line to a predetermined potential in response to the activation of a subset of the X prioritized input signals, the first portion bit line providing a bit value for the first portion of the encoded value.

11. The semiconductor device of claim 8, wherein the logic section includes a plurality of logic gates for logically combining at least two prioritized input signals to generate one of the encoder input signals.

12. The semiconductor device of claim 11, wherein each logic gate combines one of the prioritized input signals with an adjacent prioritized input signal.

13. The semiconductor device of claim 11, wherein the logic gates include OR-type gates.

14. The semiconductor device of claim 8, wherein the encoder section comprises a read-only-memory (ROM) and the encoder input signals are each coupled to different ROM word lines of the ROM.

15. The semiconductor device of claim 8, further including:
    the priority encoder circuit is formed in a semiconductor substrate and includes a first side and second side;
    a first group of CAM entries disposed on the first side of the priority encoder;
    a second group of CAM entries disposed between the first group of CAM entries and the first side of the priority encoder;
    a fourth group of CAM entries disposed on the second side of the priority encoder; and
    a third group of CAM entries disposed between the fourth group of CAM entries and the second side of the priority encoder.

* * * * *